(12) United States Patent
Fournel et al.

(10) Patent No.: US 7,544,547 B2
(45) Date of Patent: Jun. 9, 2009

(54) METHOD FOR PRODUCING A SUPPORT FOR THE GROWTH OF LOCALISED ELONGATED NANOSTRUCTURES

(75) Inventors: Frank Fournel, Villard-Bonnot (FR); Jean Dijon, Champagnier (FR); Pierre Mur, Crolles (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/625,043

(22) Filed: Jan. 19, 2007

(65) Prior Publication Data

US 2008/0318366 A1 Dec. 25, 2008

(30) Foreign Application Priority Data

Jan. 23, 2006 (FR) ................................. 06 50235

(51) Int. Cl.
*H01L 21/20* (2006.01)
(52) U.S. Cl. .................. 438/142; 977/762; 977/720; 977/763; 977/936
(58) Field of Classification Search ................ 438/584, 438/382, 459; 257/72
See application file for complete search history.

(56) References Cited

U.S. PATENT DOCUMENTS 6,261,928 B1 * 7/2001 Bruel ......................... 438/459
6,724,017 B2 * 4/2004 Semeria et al. ............. 257/183
2003/0186512 A1 10/2003 Semeria et al.
2004/0074866 A1 * 4/2004 Fournel et al. ................. 216/2
2006/0009003 A1 * 1/2006 Romano et al. ............. 438/382
2007/0228378 A1 * 10/2007 Fournel et al. ................. 257/72

FOREIGN PATENT DOCUMENTS

| FR | 2 815 121 | 4/2002 |
| JP | 2004-261630 | 9/2004 |
| WO | WO 02/29131 | 4/2002 |

OTHER PUBLICATIONS

Y. Cui, et al., "Diameter-Controlled Synthesis of Single-Crystal silicon Nanowires", Applied Physics Letters, vol. 78, No. 15, Apr. 9, 2001, pp. 2214-2216.

* cited by examiner

*Primary Examiner*—W. David Coleman
*Assistant Examiner*—Shaka Scarlett
(74) *Attorney, Agent, or Firm*—Oblon, Spivak, McClelland, Maier & Neustadt, P.C.

(57) ABSTRACT

The invention relates to a method for producing a support comprising nanoparticles (22) for the growth of nanostructures (23), said nanoparticles being organised periodically, the method being characterised in that it comprises the following steps:

providing a support comprising, in the vicinity of one of its surfaces, a periodic array of crystal defects and/or stress fields (18), depositing, on said surface, a continuous layer (20) of a first material capable of catalysing the nanostructure growth reaction, fractionating the first material layer (20) by a heat treatment so as to form the first material nanoparticles (22).

21 Claims, 8 Drawing Sheets

METHOD FOR PRODUCING A SUPPORT FOR THE GROWTH OF LOCALISED ELONGATED NANOSTRUCTURES

TECHNICAL FIELD

This invention relates to a method that makes it possible to develop a support comprising localised catalyst nanoparticles, on which it is possible to grow elongated nanostructures, of the nanowire, nanotube, nanofibre or nanocable type, which are also localised in a precise manner.

PRIOR ART

Currently, elongated nanostructures of the nanowire, nanotube, nanofibre or nanocable type are of great technological interest, in particular in the field of biology with regard to biochips and the detection of DNA sequences, or in the field of microelectronics with regard to the production of high-density sensors or field-effect transistors.

There are numerous methods for developing vertical nanowires. The majority of these methods consist of depositing, on a substrate, catalyst nanoparticles on which the nanostructures are then grown. The distribution and the size of these catalyst nanoparticles will determine the diameter, the position and the density of the nanostructures (see document [1] referenced at the end of this description).

These metal catalyst nanoparticles are generally obtained by fractionating a metal catalyst layer. This fractionation is generally performed by thermal annealing of the metal catalyst layer. For example, the annealing at between 500 and 600° C. of a nickel layer with a thickness of 10 nm, deposited on a silicon oxide, makes it possible to obtain nickel drops with an average diameter of 60 nm. The disadvantage of this technique is that it does not make it possible to easily control the position, density and diameter of the catalyst nanoparticles because they appear randomly on the surface of the substrate and are of variable size. Moreover, the density and the diameter of the nanoparticles thus obtained are very strongly correlated. It is therefore very difficult, using this technique, to precisely control the position and to independently choose the density and the diameter of the nanostructures obtained.

Certain methods make it possible to localise and precisely define the diameter of metal nanoparticles. It is possible, for example, to use techniques that will define the metal nanoparticles one by one, such as electronic lithography, for example. However, although these methods are precise, they are very time-consuming and onerous and are therefore incompatible with industrial nanostructure production.

Another method, described in documents [2] and [3], makes it possible to localise nanoparticles at the surface of a substrate. This method consists of using arrays of crystal defects and/or stress fields for inducing nucleation sites periodically localised in the plane of the substrate. These arrays of crystal defects and/or stress fields are created by bonding two crystalline substrates with one another, then by thinning one of the substrates until a very thin crystalline film of several nanometres of thickness is obtained, and by treating (for example thermally or chemically) the crystalline film in order to reveal the array of crystal defects and/or stress fields at the surface of the film. If the film is thin enough, the array of crystal defects and/or stress fields is propagated to the surface of the film during the treatment and causes the formation of specific and periodic nucleation sites at the surface of the film. The array of crystal defects and/or stress fields obtained is dependent on the characteristics of the crystal lattice of the film and the substrate, as well as the angles of disorientation introduced at the time of the bonding. It is therefore possible, by modifying these characteristics and/or these angles, to obtain different patterns and localisations of the specific nucleation sites on the surface of the film.

This method makes it possible to choose the distance between the nucleation sites and thus to set the density of the future nanostructures. This method is therefore applied to control the density and the periodicity of the nanostructures.

The problem of this technique is that the high-temperature deposition of the catalyst material on a substrate thus prepared (with preferential nucleation sites) induces a deposition directly localised at these sites. However, it may be advantageous, for some applications, to dissociate the time of the deposition and the localisation of the catalyst nanoparticles. This is the case, for example, if a material M is to be deposited once the catalyst is in drop form and said deposition cannot be done in the catalyst deposition machine (for reasons of gas compatibility, for example). By carrying out the transformation step of material M in drop form inside the deposition machine makes it possible to limit the potential contamination surface when the deposition machine is changed.

DESCRIPTION OF THE INVENTION

The objective of the invention is to obtain a method allowing for a precise localisation of the catalyst nanoparticles, which also makes it possible to obtain localised nanostructures by growth on these nanoparticles, by dissociating the deposition and the localisation of these nanoparticles.

This objective is achieved by a method for producing a support comprising nanoparticles for the growth of nanostructures, said nanoparticles being organised periodically, the method being characterised in that it comprises the following steps:

providing a support comprising, in the vicinity of one of its surfaces, a periodic array of crystal defects and/or stress fields, depositing, on said surface, a continuous layer of a first material capable of catalysing the nanostructure growth reaction, fractionating the first material layer by a heat treatment so as to form the first material nanoparticles.

The invention therefore consists of depositing, on the surface of a support having a periodic array of crystal defects and/or stress fields, a continuous layer of catalyst material, then, in a subsequent step, causing drops to form from this layer so as to form catalyst nanoparticles. This method makes it possible to dissociate the deposition step and the step of localising the nanoparticles. It is thus possible, for example, to more easily adjust the temperature and duration of the dewetting heat treatment.

The presence of the array of crystal defects and/or stress fields facilitates the dewetting or fractionation of the catalyst layer and ensures a precise localisation of the catalyst nanoparticles. The density of these nanoparticles is therefore determined by the array of crystal defects and/or stress fields, while the diameter of the nanoparticles is dependent primarily on the amount of material deposited (i.e. the thickness of the catalyst layer deposited) and the thermal budget of the fractionation treatment.

The period of the array of crystal defects and/or stress fields is advantageously chosen according to the natural self-organisation period that the nanoparticles would have on a substrate without this array of crystal defects and/or stress fields, with the thickness of the continuous layer used before the fractionation.

According to a first embodiment, the step of providing the support is achieved by carrying out the following steps:

bonding by molecular adhesion of a surface of a first substrate made of a crystalline material with a surface of a second substrate made of a crystalline material, so that said surfaces have offset crystal lattices, the bonding causing the formation of an array of crystal defects and/or stress fields in the vicinity of the bonding interface, thinning of one of the substrates until obtaining a thin film adhering to the other substrate according to the bonding interface, the thickness of the thin film being such that its free surface reveals the presence of the array of crystal defects and/or stress fields.

According to a second embodiment, the step of providing the support is obtained by carrying out the following steps:

bonding by molecular adhesion of a surface of a first substrate made of a crystalline material with a surface of a second substrate made of a crystalline material, so that said surfaces have offset crystal lattices, the bonding causing the formation of an array of stress fields and/or crystal defects in the vicinity of the bonding interface, thinning of one of the substrates until obtaining a thin film adhering to the other substrate according to the bonding interface, the thickness of the thin film being such that its free surface does not reveal the presence of the array of stress fields and/or crystal defects, the thickness of the thin film also being such that the following step can be carried out, treating the thin film, causing its free surface to reveal the presence of the array of crystal defects and/or stress fields.

The treatment of the thin film can advantageously include a heat treatment, a mechanical attack, a chemical attack, an electrochemical attack, an ion attack or a photochemical attack, alone or in combination.

According to a third embodiment, the step of providing the support is obtained by transferring a thin film on a substrate, said thin film having an array of crystal defects and/or stress fields in the vicinity of its future free surface. It is possible, for example, to use the support obtained according to one of the previous embodiments and to bond the surface of the thin film of said support with a substrate. It is then sufficient to remove (for example, by mechanical or chemical thinning) a portion of the support (in fact, it involves removing the initial substrate composing the support) until reaching the thin film.

According to another embodiment, the previous embodiments are completed. The method of production also involves a step of selective etching of the free surface of the thin film by means of preferential etching of crystal defects and/or stress fields or areas located between these defects and/or these fields, so as to obtain a periodic surface topography on the surface of the support. This topography facilitates the subsequent fractionation of the first material layer.

The first substrate and the second substrate are advantageously made of the same crystalline material.

The first substrate and/or the second substrate are advantageously made of Si, Ge, SiC, GaN, GaAs or InP.

The first material (catalyst) advantageously includes at least one metal chosen from Ni, Au, W and Pt.

Advantageously, the first material (catalyst) can thus, for example, be a stack of at least two layers of a metal material. This thus makes it possible to then obtain nanoparticles made of an alloy in the fractionation of the catalyst layer.

The method according to the invention also includes a step of forming an intermediate layer made of a second material on the surface of the support. This thus makes it possible to facilitate the dewetting of the first material layer (catalyst) and/or limit the problems of interdiffusion between the first material layer (catalyst) and the substrate. This intermediate layer is preferably deposited continuously on the support. Similarly, the thickness of this intermediate layer is such that it does not prevent the stress fields of the support from being propagated to the surface of said intermediate layer and/or allows a topography to remain at its surface. In other words, the thickness of this intermediate layer is thin enough that the intermediate layer does not block the stress fields, i.e. so that the stress fields can be propagated to the surface of said intermediate layer, or, if the support has a surface topography, the thickness of the intermediate layer must be thin enough that it does not completely smooth over the relief of the surface topography of the support. For example, if an intermediate layer of silicon oxide is used, the thickness of this layer will typically be between 1 and 100 nm above the film of the thinned support of between 3 and 50 nm comprising an array of crystal defects and/or stress fields or for a surface topography relief having an amplitude of between 2 and 10 nm.

The intermediate layer is advantageously discontinuous and localised according to the periodic array of crystal defects and/or stress fields.

The intermediate layer advantageously includes a material chosen from $SiO_2$, $Si_3N_4$, $Al_2O_3$, diamond, $HfO_2$ or a semiconductor material (for example, Si, Ge, etc.).

According to a specific embodiment related to the embodiment comprising an etching step, the substrate to which the thin film adheres is a stack comprising a layer of a third material located between another thin film of crystalline material and a substrate, the bonding surface of said substrate being the free surface of said other thin film of said stack.

The stack is advantageously a silicon-on-insulator substrate (SOI) comprising an insulating layer between a thin film of silicon and a silicon substrate.

The selective etching of the free surface of the thin film is advantageously performed until reaching the third material of the stack.

The invention also relates to a method for producing nanostructures on nanoparticles localised on a surface of a support. This method includes the implementation of the method of producing the support as described above, followed by a step of growing nanostructures on the first material nanoparticles.

BRIEF DESCRIPTION OF THE DRAWINGS

The invention can be better understood, and other advantages and special features will appear on reading the following description, given by way of a non-limiting example, and accompanied by the appended drawings in which.

DETAILED DESCRIPTION OF SPECIFIC EMBODIMENTS

We will now describe the invention by providing several examples of the production of supports having ordered catalyst nanoparticles for the growth of elongated nanostructures.

We will first produce a support having nickel nanoparticles. As a support having a periodic array of stress fields, a "twisted" substrate is used by bonding two silicon crystalline substrates. The details on the production of this "twisted" substrate are described in document [2]. The surfaces of two crystalline substrates, for example, silicon, are bonded by molecular adhesion, so that said surfaces have offset crystal lattices, the bonding causing the formation of an array of crystal defects and/or stress fields within a crystalline area in the vicinity of the bonding interface. These crystal defects and/or stress fields can be caused by the presence of dislocations at the bonding interface. One of the substrates is then thinned until obtaining a thin film adhering to the other substrate according to the bonding interface. Finally, the thin film is treated so that its free surface reveals the presence of the array of crystal defects and/or stress fields present at the bonding interface. The treatment of the thin film can be done, for example, by chemical etching and/or by providing a thermal budget and/or by the addition of chemical species to the thin film.

Figure 1A:
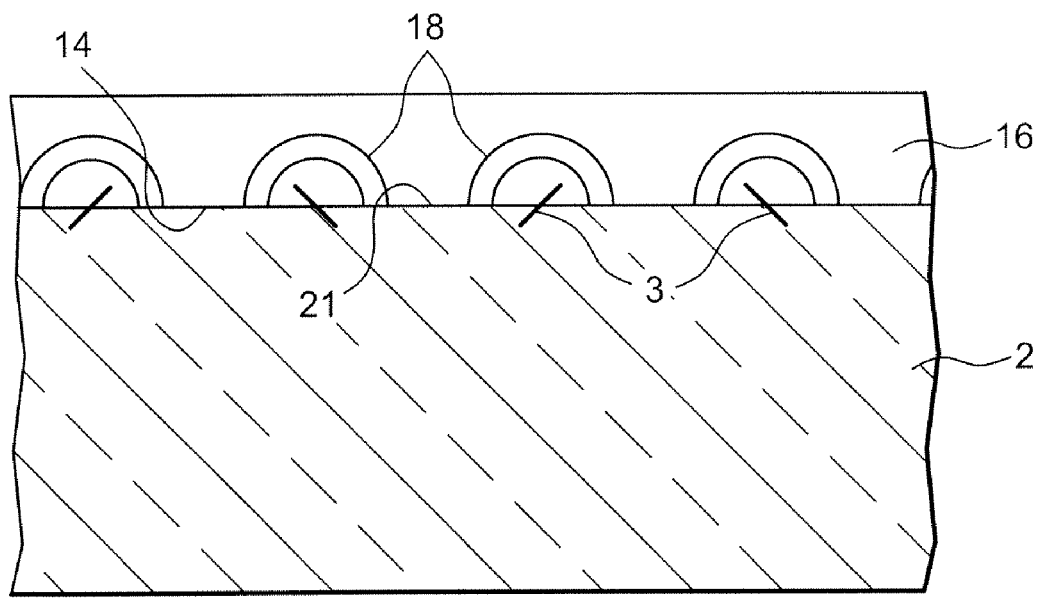
FIGS. 1A to 1E show the steps of an example of the production of nanostructures according to the invention.

In our example, the support consists of a silicon film (001) on a silicon substrate (001) with an array of crystal defects and/or stress fields at the interface. The film and the substrate have, for example, a disorientation of 0.88° in rotation without bending disorientation, which causes a square dislocation array with a period of 25 nm. A treatment is then performed, for example, chemical etching, so that the array of crystal defects and/or stress fields appears at the surface of the film (see document [2]). FIG. 1A shows stress fields, with reference 18. Note that only some stress fields have been shown. These stress fields are periodic and the period is dependent on the period of the dislocation arrays 3 present at the bonding interface 14/21, i.e. for example, at around 10 nm under the free surface of the film 16. It is possible to perform an etching operation along the stress fields so as to create a periodic surface topography relief correlated with the array of stress fields. By using an etching sensitive to the stress fields, we obtain a topography at the surface of the substrate in relation (orientation, periodicity) to the underlying array of stress fields. This topography can then be used to cause the appearance of localised and periodic nucleation sites of the catalyst nanoparticles.

The etching can optionally be performed until the stress fields and the array of dislocations at the bonding interface disappear.

Figure 1B:
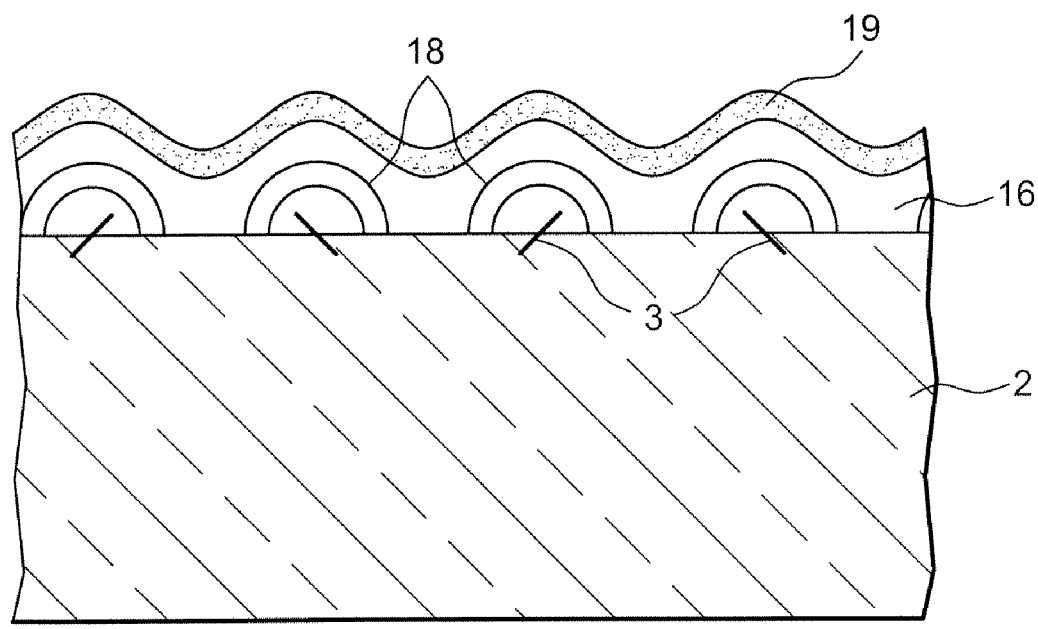
Figure 1C:
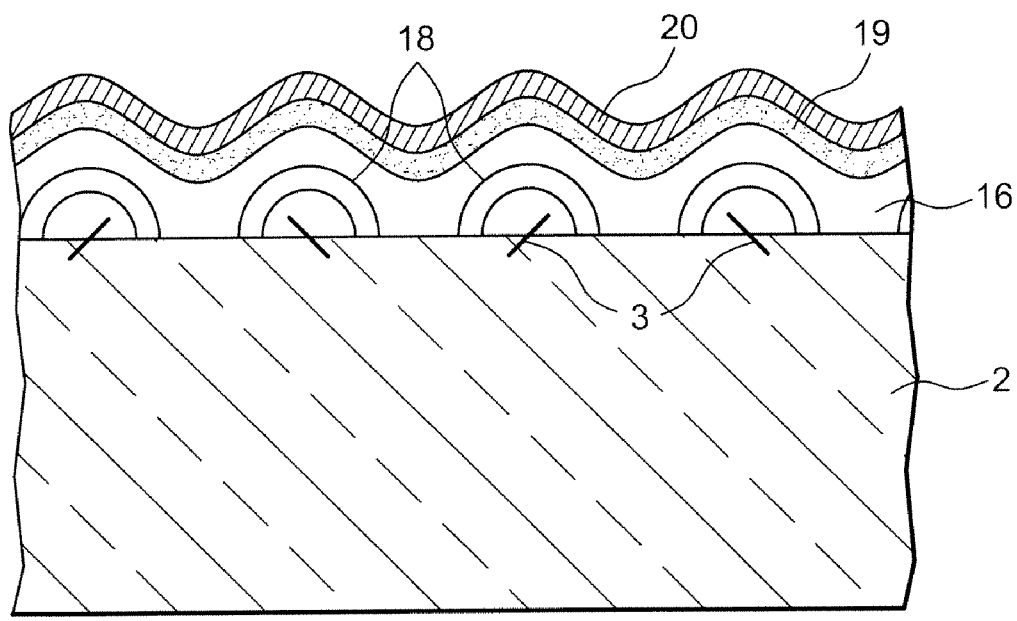
Figure 1D:
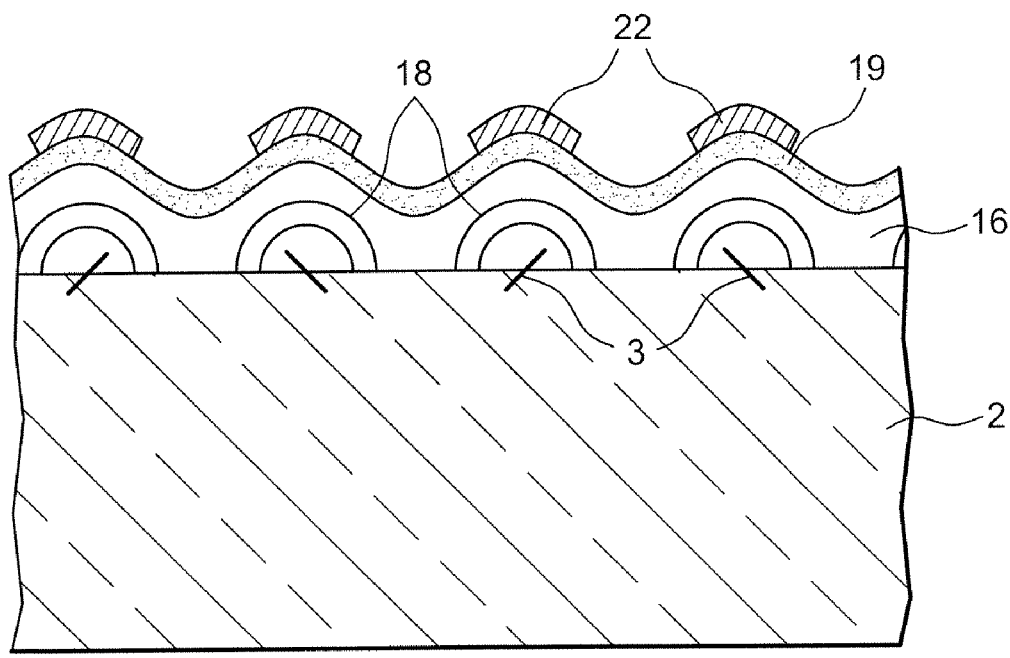

Then, the surface of the silicon film 16 is oxidised to form an intermediate oxide layer 19 (see FIG. 1B). This intermediate layer is not always necessary, in particular if the fractionation can be done directly on the support (problem of chemical affinity) or if there is no major interdiffusion between the material of the support and the catalyst material. Then, a continuous catalyst film 20, for example nickel, is deposited on the intermediate layer at low temperature (for example at room temperature) (see FIG. 1C). The assembly is brought to a higher temperature (for example 550° C.) so that the nickel film 20 fractionates. The metal drops or nanoparticles 22 are then localised according to the affinity of the metal and the underlying layer, for instance in our example, on the apexes of the relief of the surface topography (see FIG. 1D). The fractionation is indeed always designed to minimise the surface energy.

Figure 1E:
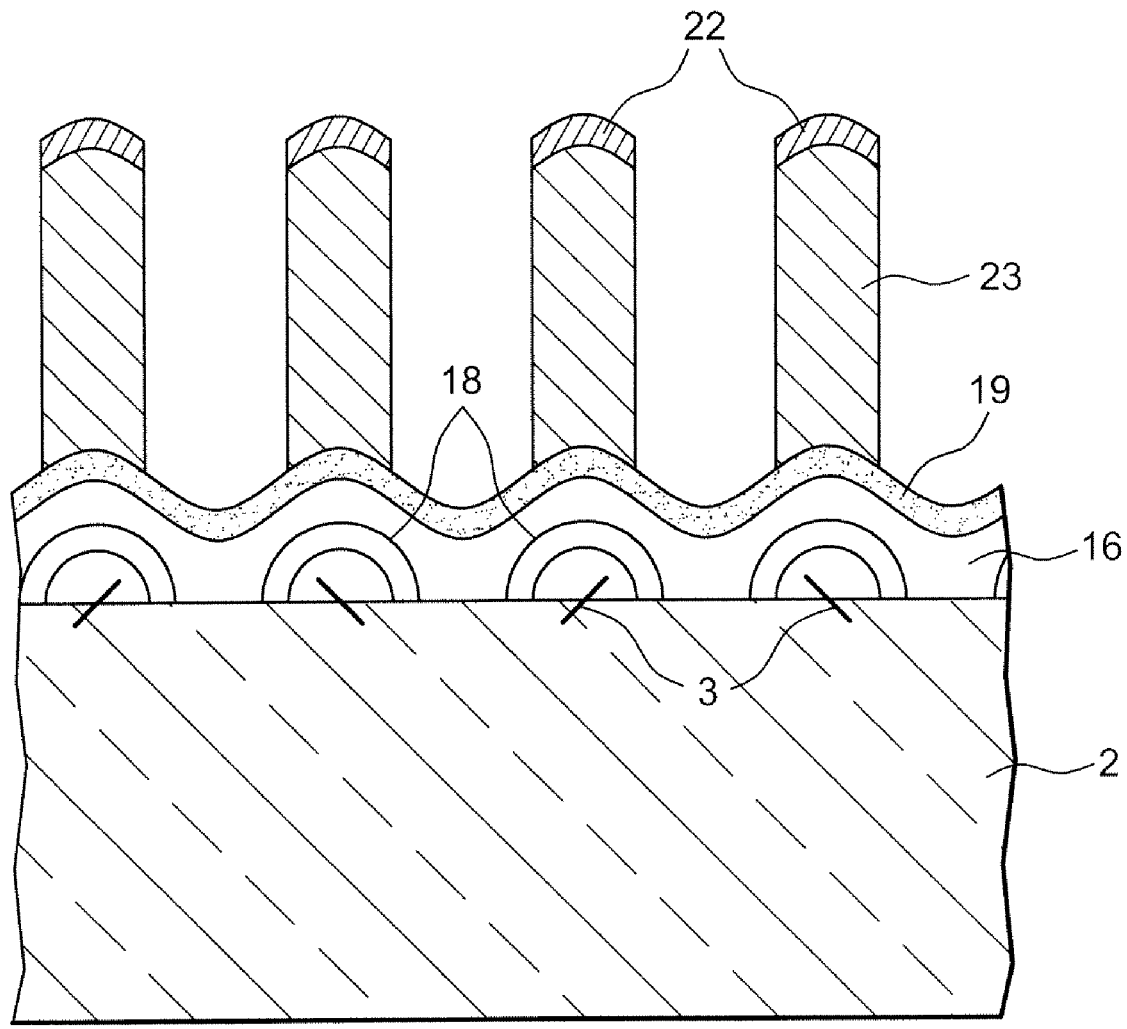

On the nickel nanoparticles 22, it is possible to grow, for example by CVD, carbon nanowires 23, also called carbon nanotubes. To do this, the assembly is placed in an acetylene atmosphere, and a thermal annealing operation is performed at a temperature of around 600° C. Similarly, it is possible to grow silicon nanowires in a silane atmosphere. The carbon nanotubes 23 thus grow where the nickel nanoparticles 22 are located and the position, density and diameter of the nanostructures 23 are thus well controlled (see FIG. 1E).

To have a different localisation and density of carbon nanostructures, it is possible to change the disorientation between the substrate and the film. For example, as above, the surfaces of two silicon crystalline substrates are bonded by molecular adhesion, the surfaces of the two substrates being placed so as to have a disorientation of 0.44° in rotation without bending disorientation at the bonding interface, which makes it possible to obtain a periodicity of 50 nm. Then, the thinning of one of the substrates is performed until obtaining a thin film 16, and said thin film is treated so as to cause stress fields 18 to appear at the surface of the film (see FIG. 1A). It is then possible to optionally perform an etching operation along the stress fields in order to create a relief or a topography at the surface of the film 16 (see FIG. 1B). We thus obtain a periodic surface topography correlated with the array of stress fields 18 and the array of dislocations 3 present at the bonding interface. Then, the silicon surface 16 is oxidised in order to form an oxide layer 19 of 10 nm and a nickel film 20 with a thickness of 5 nm is deposited at low temperature (for example, at room temperature) (see FIG. 1C). The assembly is brought to a higher temperature (for example 550° C.) so that the nickel film fractionates (see FIG. 1D). Finally, the assembly is placed in an acetylene atmosphere and carbon nanotubes 23 are grown on the nickel nanoparticles 22 (see FIG. 1E).

Figure 2A:
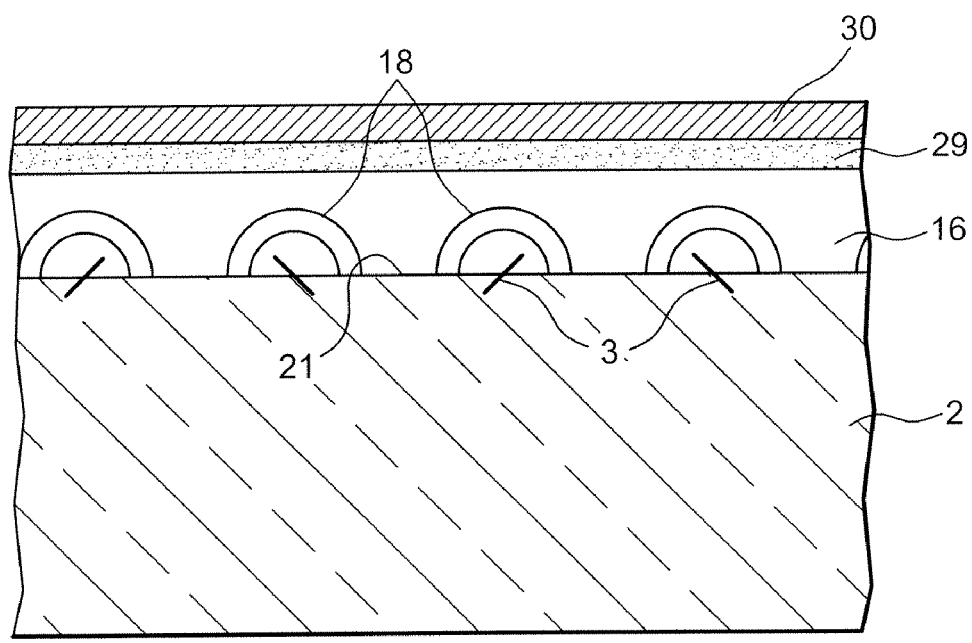
FIGS. 2A to 2C show the steps of another example of the production of nanostructures according to the invention.

We can also produce a support having silicon nanowires using gold nanoparticles. As in the previous examples, the surfaces of two silicon crystalline substrates are bonded, one of the substrates is thinned to obtain a thin film 16, and the treatment of the thin film is performed, for example by a heat treatment, so as to cause stress fields 18, present at the bonding interface, to appear at the surface of the thin film. The film and the substrate have, for example, a disorientation of 0.88° in rotation without bending disorientation, which makes it possible to obtain a periodicity of 25 nm. The surface is oxidised to form an intermediate silicon oxide layer 29 of 5 nm at the surface of the thin film, and a gold film 30 is deposited at low temperature (for example at room temperature) on said intermediate layer (see FIG. 2A). In this case, as the intermediate layer has a thickness of only 5 nm, this thickness is thin enough not to block the stress fields 18: the stress fields 18 can be propagated to the surface of the intermediate layer 29 (the propagation of stress fields is not shown) and the influence of crystal defects and/or stress fields can appear at the surface of the layer 29. It is therefore unnecessary to carry out a selective etching step along the stress fields.

Figure 2B:
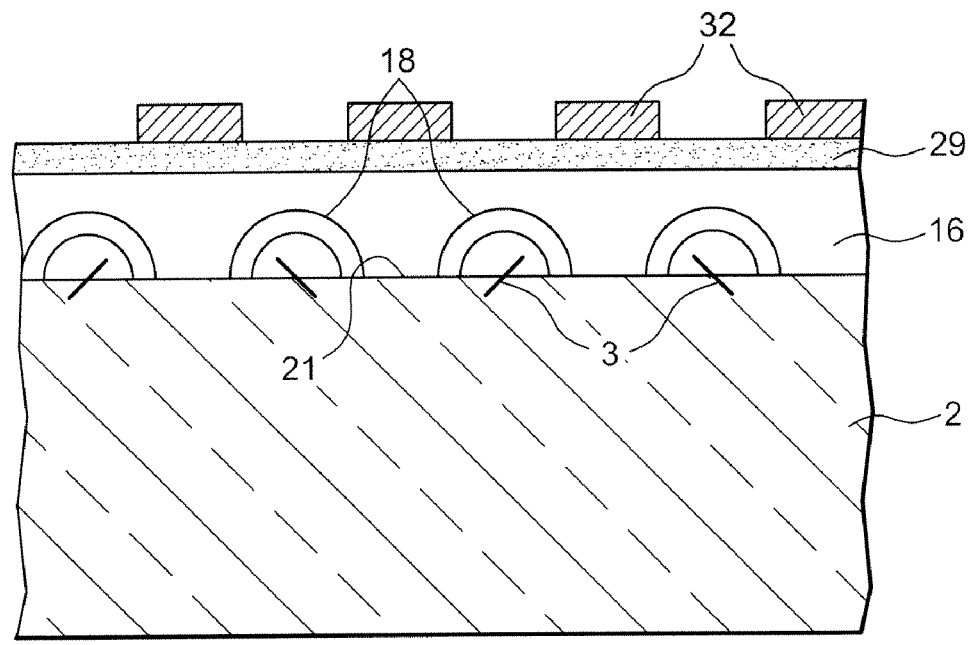
Figure 2C:
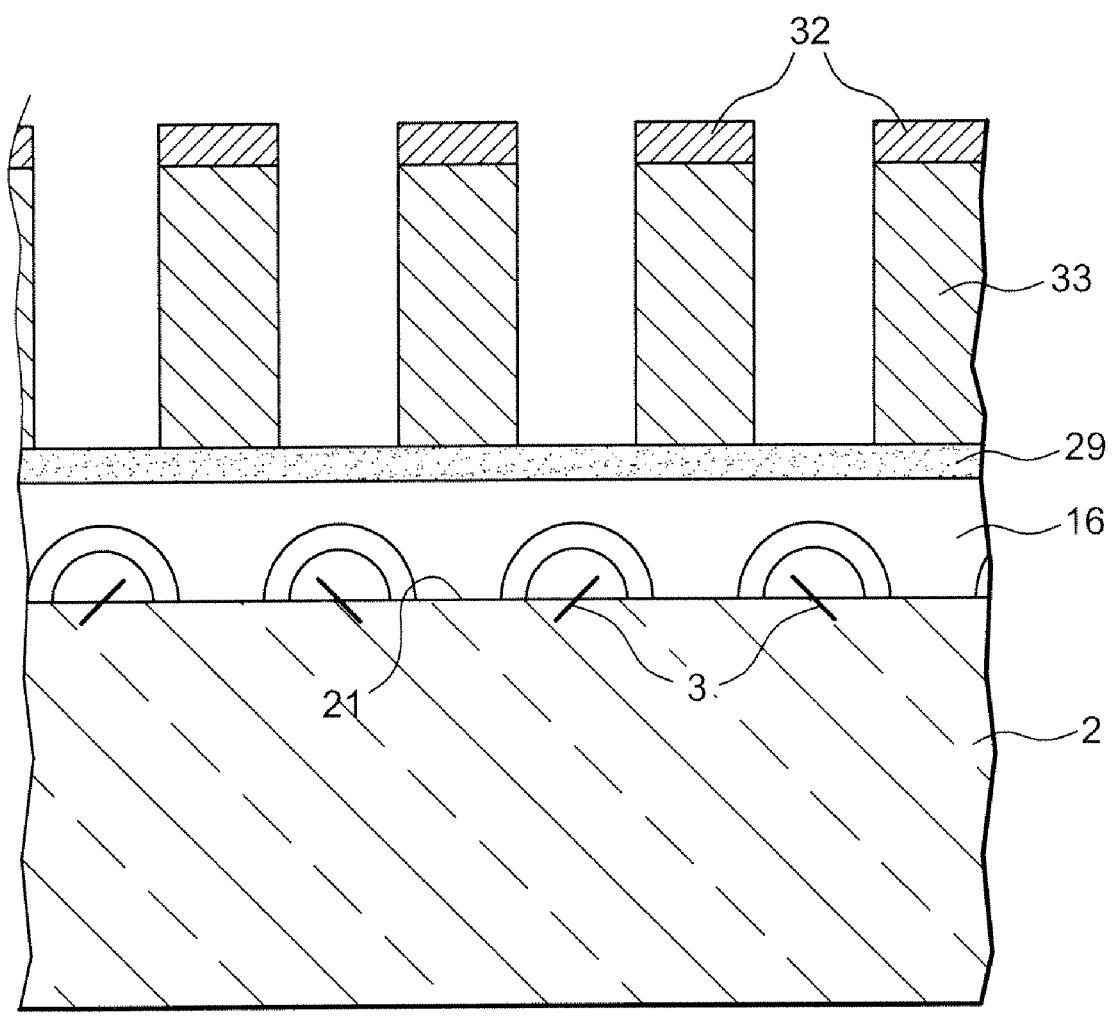

Then, the assembly is brought to a higher temperature (for example 550° C.) so that the gold film 30 fractionates. The (gold) metal drops 32 are then localised by the stress fields (see FIG. 2B). Then, the assembly is placed in a $SiH_4$ atmosphere, and silicon nanowires 33 are grown on the gold nanoparticles (see FIG. 2C).

Figure 3A:
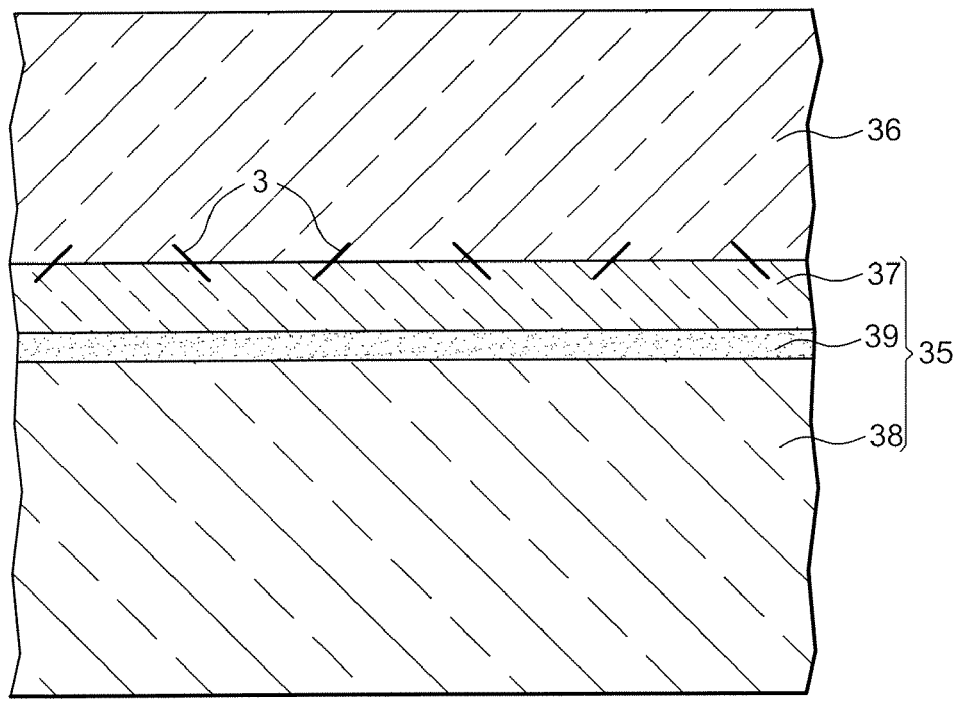
FIGS. 3A to 3F show the steps of a third example of the production of nanostructures according to the invention.
Figure 3B:
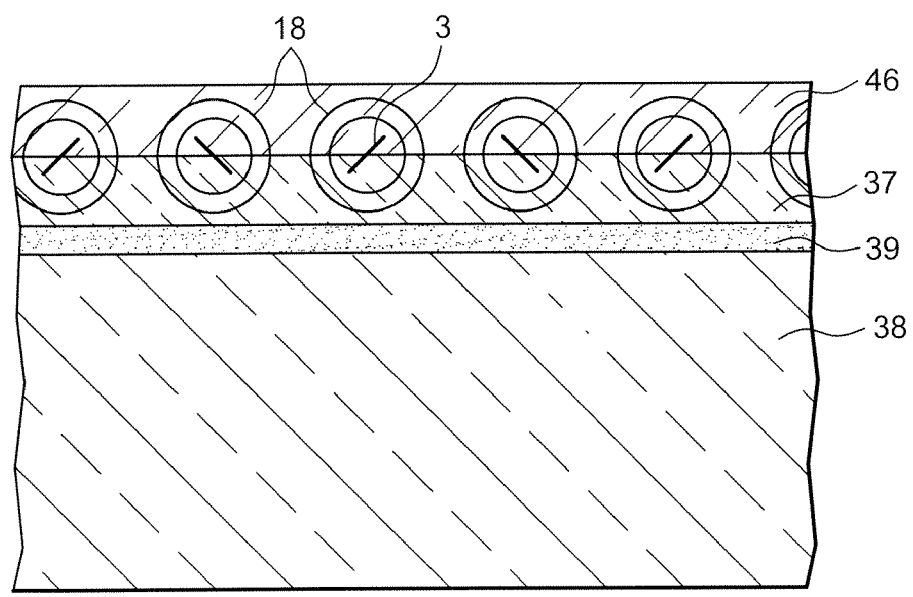
Figure 3C:
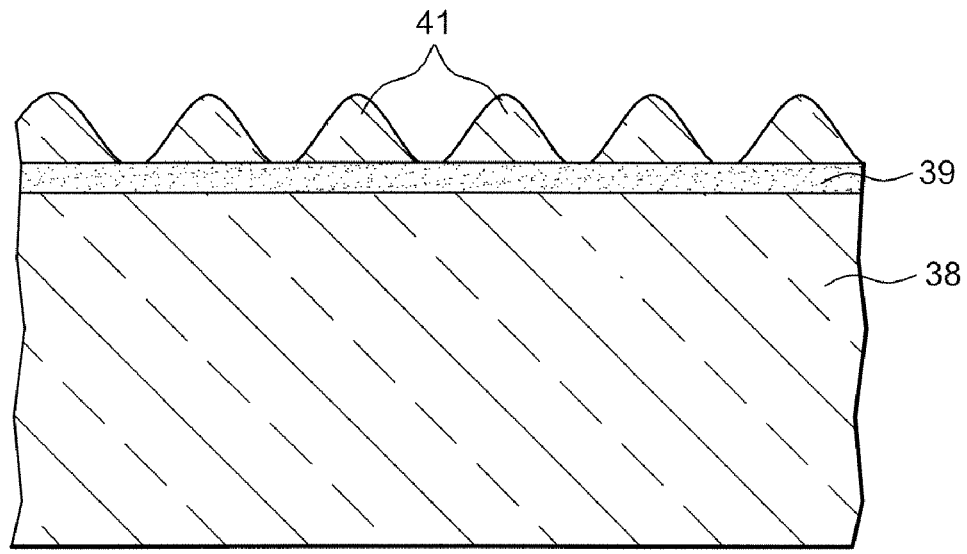
Figure 3D:
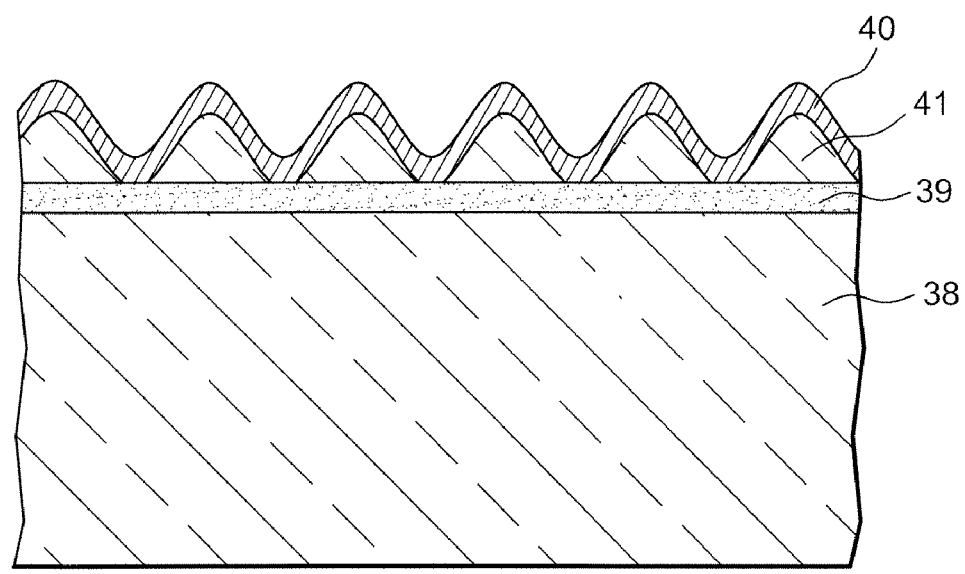
Figure 3E:
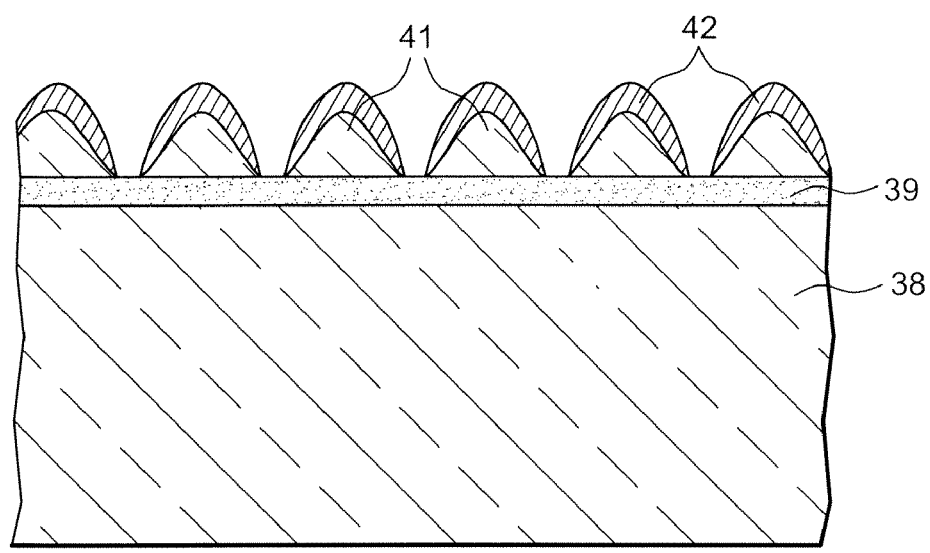
Figure 3F:
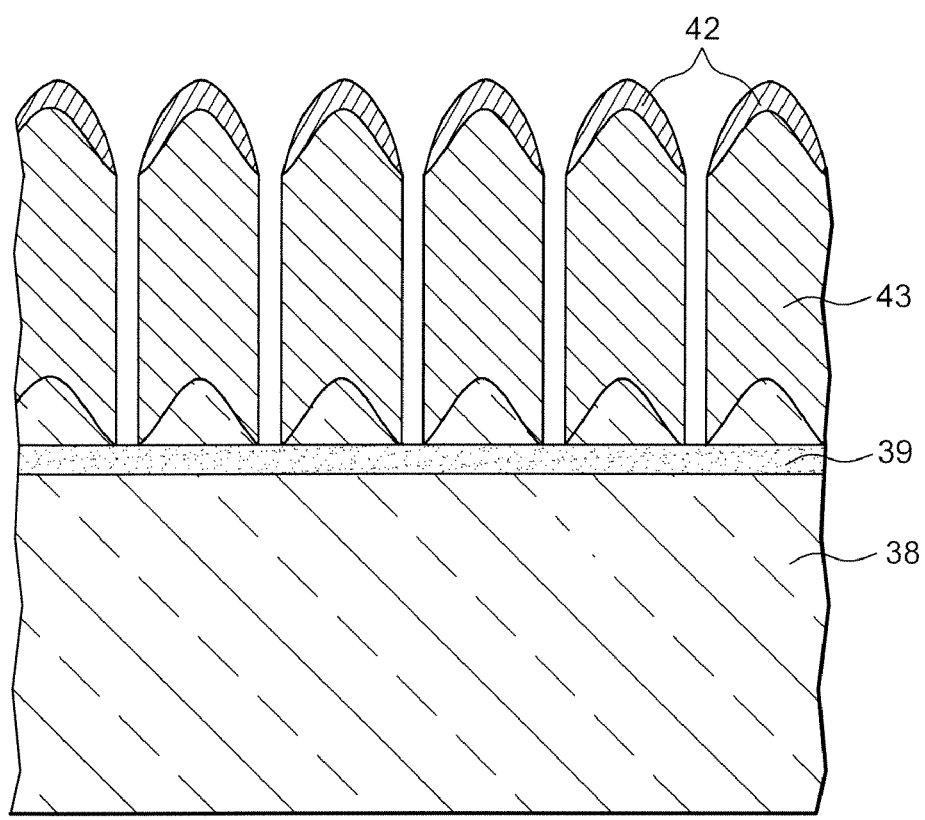

According to another embodiment, it is possible, for the purpose of facilitating the fractionation of the catalyst layer, to use a surface having not only a surface topography, but also two distinct materials. Indeed, during the formation of the surface topography by selective etching of the stress fields, it is possible, if this etching reaches a layer of a different material, to obtain two types of materials at the surface of the substrate. The localisation of metal drops during the fractionation of the metal film is thus facilitated. For example, it is possible to bond a "SOI" (silicon-on-insulator) structure 35 comprising a buried silicon oxide layer 39 (the layer is located between the support substrate 38 and a thin film 37) with a second SOI structure or with a silicon substrate 36 that must then be thinned. The SOI structure 35 and the silicon substrate 36 are bonded by hydrophobic molecular adhesion with a disorientation angle of 0.88° without bending disorientation, which creates an array of crystal defects and/or stress fields (in FIG. 3A, only the dislocations at the bonding interface are shown, symbolised by reference 3, so as to simplify the drawing). The silicon substrate 36 (or the back surface of the second SOI structure) is thinned so as to retain only a thin film 46 of silicon (see FIG. 3B). Then, a selective etching operation is performed along the stress fields 18 of the array of dislocations 3 present at the bonding interface, and the etching is continued (optionally by changing the type of etching) until reaching the buried oxide layer 39. We thus obtain a periodic relief formed by silicon nanocrystals on a silicon oxide layer 39 (see FIG. 3C). A gold film 40 is then directly deposited at low temperature (for example at room temperature) on the surface of the support comprising the silicon nanocrystals 41 (see FIG. 3D). Then, the assembly is brought to a high temperature (for example 500° C.) so as to fractionate the metal film 40. The metal drops 42 are then localised on the silicon nanocrystals 41 (see FIG. 3E). The fact that there is silicon oxide 39 between the silicon nanocrystals facilitates the fractionation of the gold layer 40 and the localisation of the gold drops 42 on the silicon nanocrystals 41, because the affinity of the gold is different with silicon and with silica: in this case, the buried SOI layer 39 serves as an intermediate layer. It is then possible to grow silicon nanostructures 43 of the nanowire type on the gold drops 42 by placing the assembly in a silane atmosphere and carrying out a thermal annealing operation, for example at 440° C., on the assembly (see FIG. 3F).

Alternatively, it is possible, in order to obtain a surface having not only a surface topography, but also two distinct materials and thus to facilitate the subsequent fractionation, to deposit, before the deposition of the continuous catalyst layer, an intermediate layer sensitive to the topography and/or to the underlying array of stress fields and/or crystal defects. This layer will then be present only locally. For example, it is possible to deposit germanium on a silicon surface, on which an array of stress fields and/or crystal defects is revealed as described above: the germanium becomes localised at the projecting areas of the silicon surface. Then, the deposition of the continuous catalyst layer can be carried out.

BIBLIOGRAPHY

[1] Yi Cui, Lincoln J. Lauhon, Mark S. Gudiksen, Jianfang Wang, and Charles M. Lieber, Applied Physics Letters Volume 78, Number 15, 9 Apr. 2001, 2214.
[2] Patent application FR 2815121-A1.
[3] Patent application FR 2766620-A1.

The invention claimed is:

1. Method for producing a support comprising nanoparticles for the growth of nanostructures, said nanoparticles being organised periodically, the method being characterised in that it comprises the following steps:
    providing a support comprising, in the vicinity of one of its surfaces, a periodic array of crystal defects and/or stress fields,
    depositing, on said surface, a continuous layer of a first material capable of catalysing the nanostructure growth reaction,
    fractionating the first material layer by a heat treatment so as to form the first material nanoparticles,
    wherein the periodic array of crystal defects and/or stress fields has a period chosen according to the natural self-organisation period that the nanoparticules would have on a surface of a support free of any crystal defects and/or stress fields and
    wherein the step of providing the support is achieved by carrying out the following steps:
        bonding by molecular adhesion a surface of a first substrate made of a crystalline material with a surface of a second substrate made of a crystalline material, so that said surfaces have offset crystal lattices, the bonding causing the formation of an array of crystal defects and/or stress fields in the vicinity of the bonding interface,
        thinning one of the substrates until obtaining a thin film adhering to the other substrate according to the bonding interface, the thickness of the thin film being such that its free surface reveals the presence of the array of crystal defects and/or stress fields.

2. Method of production according to claim 1, further comprising a step of selective etching of the free surface of the thin film by means of preferential etching of crystal defects and/or stress fields or areas located between these defects and/or these fields, so as to obtain a periodic surface topography on the surface of the support.

3. Method of production according to claim 1, wherein the first substrate and the second substrate are made of the same crystalline material.

4. Method of production according to claim 1, wherein the first substrate and/or the second substrate are preferably made of Si, Ge, SiC, GaN, GaAs or InP.

5. Method of production according to claim 1, wherein the substrate to which the thin film adheres is a stack comprising a layer of a third material located between another thin film of crystalline material and a substrate, the bonding surface of said substrate being the free surface of said other thin film.

6. Method of production according to claim 5, wherein the stack is a silicon-on-insulator substrate (SOI) comprising an insulating layer between a thin film of silicon and a silicon substrate.

7. Method of production according to claim 5, wherein the selective etching is performed until reaching the layer of third material of the stack.

8. Method of production according to claim 1, further comprising a step of forming an intermediate layer made of a second material on the surface of the support.

9. Method for producing a support comprises nanoparticles for the growth of nanostructures, said nanostructures being organized periodically, the method being characterized in that it comprises the following steps:
    providing a support comprising, in the vicinity of one of its surfaces, a periodic array of crystal defects and/or stress fields,
    depositing, on said surface, a continuous layer of a first material capable of catalyzing the nanostructure growth reaction,
    fractionating the first material layer by a heat treatment so as to form the first material nanoparticles,
    wherein the periodic array of crystal defects and/or stress fields has a period chosen according to the natural self-organisation period that the nanoparticules would have on a surface of a support free of any crystal defects and/or stress fields and
    wherein the step of providing the support is achieved by carrying out the following steps:
        bonding by molecular adhesion a surface of a first substrate made of a crystalline material with a surface of a second substrate made of a crystalline material, so that said surfaces have offset crystal lattices, the bonding causing the formation of an array of crystal defects and/or stress fields in the vicinity of the bonding interface,
        thinning one of the substrates until obtaining a thin film adhering to the other substrate according to the bonding interface, the thickness of the thin film being such that its free surface reveals the presence of the array of crystal defects, the thickness of the thin film also being such that the following step can be carried out, treating the thin film, causing its free surface to reveal the presence of the array of crystal defects and/or stress fields.

10. Method of production according to claim 9, wherein the treatment of the thin film is chosen from a heat treatment and/or a mechanical attack and/or a chemical attack and/or an electrochemical attack and/or an ion attack and/or a photochemical attack.

11. Method of production according to claim 9, further comprising a step of selective etching of the free surface of the thin film by means of preferential etching of crystal defects and/or stress fields or areas located between these defects and/or these fields, so as to obtain a periodic surface topography on the surface of the support.

12. Method of production according to claim 9, wherein the first substrate and the second substrate are made of the same crystalline material.

13. Method of production according to claim 9, wherein the first substrate and/or the second substrate are preferably made of Si, Ge, SiC, GaN, GaAs or InP.

14. Method of production according to claim 2, wherein the substrate to which the thin film adheres is a stack comprising a layer of a third material located between another thin film of crystalline material and a substrate, the bonding surface of said substrate being the free surface of said other thin film.

15. Method of production according to claim 14, wherein the stack is a silicon-on-insulator substrate (SOI) comprising an insulating layer between a thin film of silicon and a silicon substrate.

16. Method of production according to claim 14, wherein the selective etching is performed until reaching the layer of third material of the stack.

17. Method of production according to claims 1 or 9, wherein the first material includes at least one metal chosen from Ni, Au, W and Pt.

18. Method for producing nanostructures on nanoparticles localized on a surface of a support, said method being characterised in that it includes the implementation of the method for producing the support according to claims 1 or 9, followed by a step of growing nanostructures on the first material nanoparticles.

19. Method of production according to claim 9, further comprising a step of forming an intermediate layer made of a second material on the surface of the support.

20. Method of production according to claims 8 or 19, wherein the intermediate layer is discontinuous and localised according to the periodic array of crystal defects and/or stress fields.

21. Method of production according to claim 8 or 19, wherein the intermediate layer includes a material chosen from $SiO_2$, $Si_3N_4$, $Al_2O_3$, diamond, $HfO_2$ or a semiconductor material.

* * * * *